US008355762B2

(12) United States Patent  (10) Patent No.: US 8,355,762 B2
Kido  (45) Date of Patent: Jan. 15, 2013

(54) ELECTRONIC DEVICE AND FLAT DISPLAY MODULE

(75) Inventor: Nobuhiko Kido, Kanagawa (JP)

(73) Assignee: Sony Mobile Communications AB, Lund (SE)

( * ) Notice: Subject to any disclaimer, the term of this patent is extended or adjusted under 35 U.S.C. 154(b) by 214 days.

(21) Appl. No.: 12/780,386

(22) Filed: May 14, 2010

(65) Prior Publication Data

US 2011/0111807 A1  May 12, 2011

(30) Foreign Application Priority Data

Nov. 6, 2009 (JP) ................................. 2009-254702

(51) Int. Cl.
H04M 1/00 (2006.01)
H04B 1/38 (2006.01)

(52) U.S. Cl. .................................. 455/575.1; 455/566
(58) Field of Classification Search .................. 455/566, 455/575.1, 90.3, 550.1, 67.15, 572, 128, 455/158.5, 158.4; 248/473, 918, 903
See application file for complete search history.

(56) References Cited

U.S. PATENT DOCUMENTS

| | | | |
|---|---|---|---|
| 7,397,520 B2 * | 7/2008 | Kobayashi et al. | 349/58 |
| 2005/0068717 A1 * | 3/2005 | Nakanishi et al. | 361/681 |
| 2006/0049986 A1 * | 3/2006 | Dunn et al. | 343/700 MS |
| 2006/0222174 A1 * | 10/2006 | Kang et al. | 379/433.07 |

FOREIGN PATENT DOCUMENTS

| | | |
|---|---|---|
| EP | 1 592 208 A2 | 11/2005 |
| EP | 1 727 412 A1 | 11/2006 |
| EP | 1 865 761 A2 | 12/2007 |
| GB | 2 336 019 A | 10/1999 |
| JP | 2001-257754 | 9/2001 |
| JP | 2006-139100 | 6/2006 |
| JP | 2006139100 A * | 6/2006 |
| JP | 2008-130912 | 6/2008 |
| JP | 2008-209468 | 9/2008 |
| JP | 2008209468 A * | 9/2008 |
| JP | 2009-116072 | 5/2009 |

OTHER PUBLICATIONS

Extended European Search Report issued Sep. 1, 2010, in Patent Application No. 10166183.3.
Office Action issued Aug. 26, 2011 in Japan Application No. 2009-254702.

* cited by examiner

Primary Examiner — Andrew Wendell
Assistant Examiner — Cindy Trandai
(74) Attorney, Agent, or Firm — Oblon, Spivak, McClelland, Maier & Neustadt, L.L.P.

(57) ABSTRACT

Disclosed is electronic device including a case body including a front surface side portion of the case body and a rear surface side portion of the case body; a flat display module accommodated in the case body; a conductive layer formed on an internal wall of one of the front surface side portion of the case body and the rear surface side portion of the case body, the internal wall being around a contact portion of both portions of the case body; a circuit board having electrical components mounted thereon; and a ground means that electrically connects the conductive layer to a GND of the circuit board.

14 Claims, 10 Drawing Sheets

100

Related Art

ELECTRONIC DEVICE AND FLAT DISPLAY MODULE

BACKGROUND OF THE INVENTION

1. Field of the Invention

The present invention relates to electronic device whose representative is a mobile phone terminal and a flat display module used for the same.

2. Description of the Related Art

Recently, a mobile terminal having a flat display using a flat display panel mounted thereon is widely used, which is a representative of liquid crystal display (LCD). In this situation, it is important to prepare measures for electrostatic discharge (ESD) with respect to the flat display module as a component having the flat display panel mounted therein in order to guarantee quality and reliability of products.

For example, in the case of the liquid crystal module, a transparent electrode constructed of ITO (Indium Tin Oxide) and the like is exposed on its surrounding side, and a liquid crystal driving circuit to drive the liquid crystal module and the like are arranged on the side of the display unit. When the ESD enters into these portions, there is a concern that it causes a display malfunction of the liquid crystal display or an eternal destruction of components. Accordingly, it is desirable to protect the liquid crystal panel and driving circuit from ESD.

As to the ESD measure, it is desirable to obtain a way in which a minimization of a case body can be promoted without increasing the number of components and affecting a mechanism structure as much as possible. As to an ESD measure with respect to camera and speaker of mobile terminal apparatus, a technology described in JP-A-2008-130912 is suggested as a way in which a minimization of a case body can be promoted without increasing the number of components.

SUMMARY OF THE INVENTION

As a method for a general ESD measure, it is effective to physically cover a transparent electrode portion using a vessel or a frame molded using plastic, stainless steel or the like. However, it is also desirable to make an external size of the liquid crystal module small in order to make the mobile terminal smaller and thinner. Use of the vessel or frame is against this request and is a severe hindrance to the minimization of the terminal.

Since the technology described in the JP-A-2008-130912 demands a holding portion to accommodate and hold electronic components in an internal side of the case body, a restriction occurs in its mechanism structure and it is difficult to apply the technology to ESD with respect to a liquid crystal module.

It is desirable to prepare the ESD measure with respect to a flat display module while eliminating restriction to a mechanism structure of the electronic device as much as possible.

Electronic device according to an embodiment of the invention includes a case body including a front surface side portion of the case body and a rear surface side portion of the case body; a flat display module accommodated in the case body; a conductive layer formed on an internal wall of one of the front side portion of the case body and the rear side portion of the case body, the conductive layer being near a contact portion of both portions of the case body; a circuit board having electrical components mounted thereon; and a ground means that electrically connects the conductive layer to GND of the circuit board.

According to the construction, ESD entering into the case body from outside is captured on the conductive layer and electrically connected to GND of the circuit board by the ground means. Therefore, ESD is prevented from entering to the electrode which is exposed on the surrounding side of the flat display module.

When the front side portion of the case body is a transparent plate, the conductive layer may be formed on the rear side of the transparent plate.

The conductive layer may be formed along the periphery of the transparent plate for example, in a band shape. It may be possible to cover the area near the coupling portion of both case body portions.

The ground means may be constructed of the conductive member having elasticity. By doing this, it may be possible to guarantee an electrical contact with pressure force when assembling the electronic device.

Preferably, the conductive foil is deposited on the conductive layer, and the conductive member is contacted with the conductive layer through the conductive foil. By doing this, the conductive layer is protected from destruction caused by ESD even though it is an extremely thin sheet.

When including the flexible substrate arranged in the case body, the conductive member is electrically connected to GND of the circuit board through the flexible substrate.

When the electronic device is a mobile phone terminal having an earphone portion on the upper end portion of the case body, it may make use of the fact that the conductive member is installed on the side portion of the earphone portion and the flexible substrate is used to provide signal to the earphone portion.

The flat display module according to an embodiment of the invention includes a flat display panel; a transparent plate that is arranged to overlap with the front side of the flat display panel; a driving circuit that drives the flat display panel; a conductive layer formed on the peripheral portion of the rear side of the transparent plate; and a conductive member to electrically connect the conductive layer to an external GND.

According to the embodiment of the invention, it is desirable to prepare the ESD measure with respect to a flat display module while eliminating restriction to a mechanism structure of the electronic device as much as possible, and accordingly, malfunction or destruction of components may be prevented without restricting minimization of the device.

DESCRIPTION OF THE PREFERRED EMBODIMENTS

Hereinafter, a preferred embodiment of the invention will be described with reference to the accompanying drawings. A liquid crystal module is described as an example of a flat display module. A liquid crystal panel is used as an example of a flat display panel constituting a flat display module.

Figure 1:
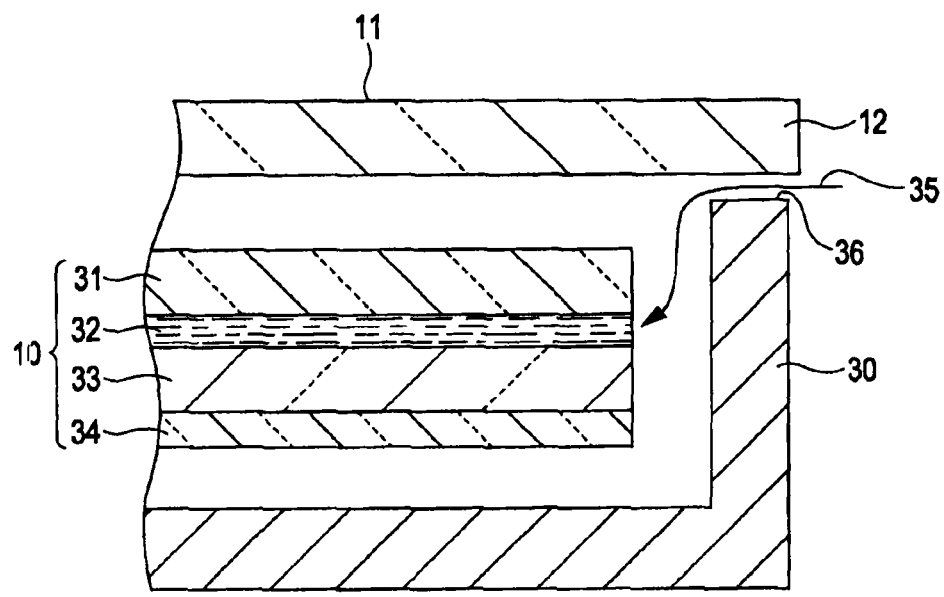
FIG. 1 is a sectional diagram illustrating a main portion of electronic device having a general liquid crystal display mounted therein.

FIG. 1 is a sectional diagram illustrating a main portion of electronic device having a general liquid crystal display (LCD) mounted therein.

As illustrated in the drawing, generally, a liquid crystal panel constructing LCD becomes a liquid crystal module that has an electronic circuit to provide image signals and driving power and an optical source for backlight attached thereon as a unit and is accommodated in a case body. The case body is assembled by overlapping a front side portion 12 of the case body and a rear side portion 30 of the case body. Accordingly, a gap 36 inevitably occurs at a contact portion of the portions of the case body, and it becomes an ESD entry path 35 into the case body.

Meanwhile, the liquid crystal module 10 commonly includes a liquid crystal layer 32 filled between glass plates 31 and 33 and a light guide plate 34 constructed of a light source (not shown) and a back light. Further, a transparent electrode layer is formed on the glass plates 31 and 33 to apply voltage to the liquid crystal layer. Although not illustrated, a polarization plate may be included depending on the kind of the liquid crystal panel, and a color filter is included in the case of a color liquid crystal module.

When the periphery portion of the liquid crystal module 10 is used without being covered with a bezel or a frame, ESD enters from a gap 36 of the case body and reaches to the nearest conductor. In particular, when ESD enters the surroundings of the LCD from outside, in many cases, the transparent electrode exposed to the surrounding side of the liquid crystal module 10 is nearest to the entrance of ESD, and it is easy for ESD to reach the transparent electrode. This structure causes a display malfunction and the permanent destruction of the liquid crystal display by ESD.

However, in the terminal of the structure described above, it is not possible to physically cover a liquid crystal circuit portion using the bezel or frame in view of design, screen size and case body size.

Then, even though it is such a construction in an embodiment of the invention, it is possible to provide a conductive structure to secure GND for ESD measure of the liquid crystal module portion nearly without changing the construction described above.

Figure 2:
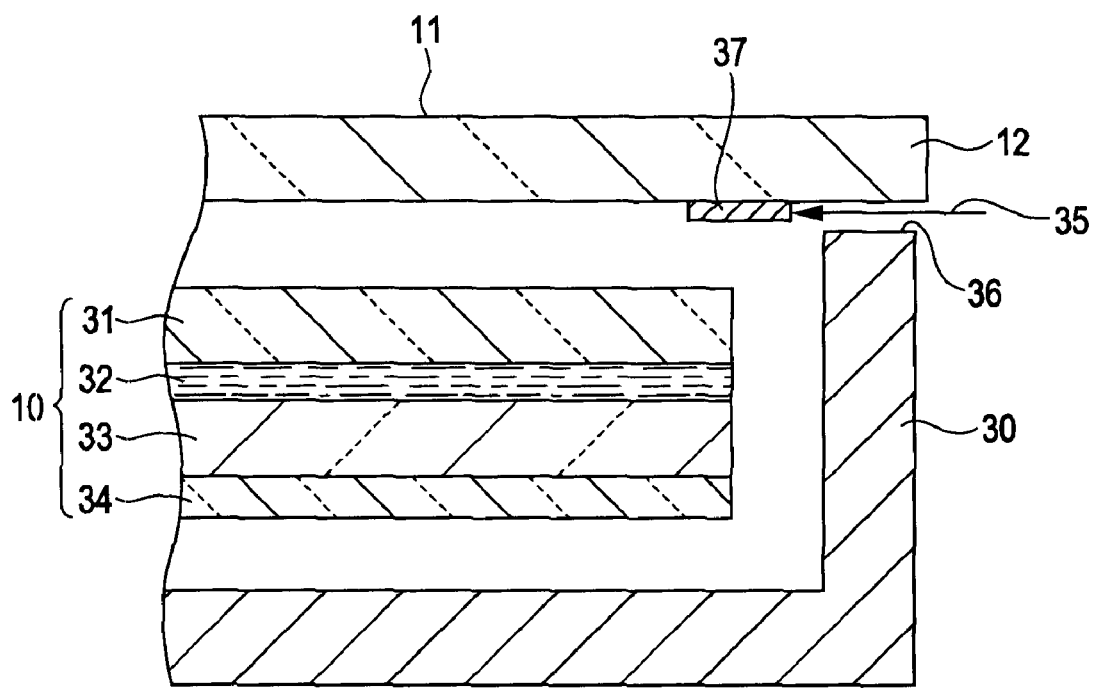
FIG. 2 is a diagram explaining a principle of an embodiment of the invention.

FIG. 2 is a diagram explaining a principle of an embodiment of the invention. The same portions as those illustrated in FIG. 1 have the same reference numerals so that the overlapping description will be omitted.

A conductive layer 37 is formed on an area of at least a band shape and a ring shape along the periphery of the transparent plate, near a position of the case body which is nearer than the periphery portion of the liquid crystal module 10 viewed from the gap 36, in this example, near the gap 36 that is a contact portion of both portions of the base body on the rear surface (inner wall) of the front side portion 12 of the case body, and this is electrically connected to the GND in the terminal. The conductive layer 37 may be formed of a layer deposited with metal such as aluminum or chrome. Besides, it may be formed by a coating of conductive paint. According to this structure, ESD entering the device reaches the conductive layer 37 that is nearer than the transparent electrode of the liquid crystal panel periphery, and is discharged to the GND in the terminal. As a result, the LCD and its driving circuit may be protected.

Figure 3:
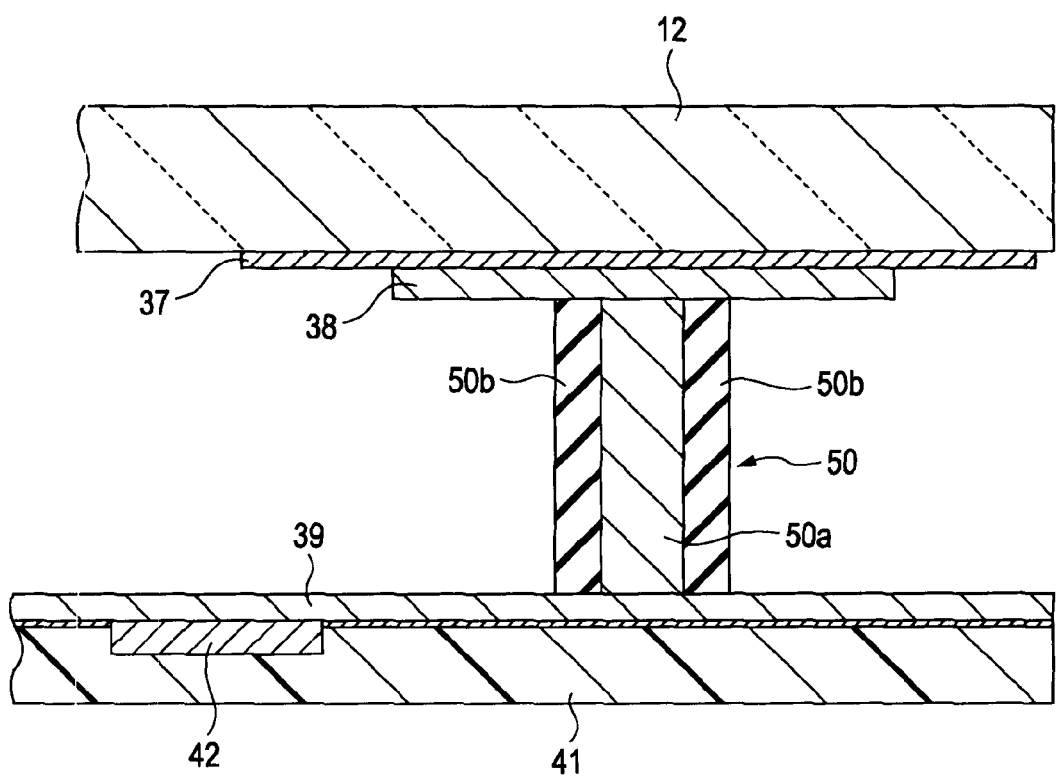
FIG. 3 is a diagram illustrating a constructional example of a means to ground a conductive layer in an embodiment of the invention.

FIG. 3 illustrates a constructional example of a ground means to ground a conductive layer 37. The conductive layer 37 formed on the inner surface of the front side portion 12 of the case body is connected to GND of an existing substrate in the case body, a flexible substrate 41 here, through a conductive member in the embodiment. A conductive rubber 50 is used as the conductive member in this example. The conductive rubber 50 includes a conductive member 50a of a core portion, and a rubber portion 50b around it in a cylindrical shape, which has extendable elasticity at least in an axial direction. While it may be possible to connect the conductive rubber 50 and conductive layer 37 directly, a conductive foil 38 is inserted between them in this embodiment. The conductive layer 37 is an extremely thin film formed by deposition or the like, which may be destructed while ESD passes through it. The conductive foil 38 may be a metal foil of aluminum or copper which is sufficiently thicker than the conductive layer 37, for example. The conductive foil 38 covers at least a contact portion between the conductive layer 37 and the conductive rubber 50. The larger the contact area between the conductive layer 37 and the conductive foil 38 becomes, the more the tolerance to ESD is enhanced.

Further, although not illustrated, in order to enhance durability of the conductive layer 37, the entire surface of it may be coated (covered) with a protective film (dielectric). However, the protective film on a position contacted with the conductive portion 52 of the conductive rubber 50 is removed (or is not formed) in order to secure an electrical conduction.

A conductive foil 39 is also installed on a flexible substrate 41, and is electrically connected to GND portion 42 on the flexible substrate 41. The conductive foil 39 is formed to strengthen the GND. In this example, one end of the conductive rubber 50 is attached to the conductive foil 38 on the conductive layer 37, and the other end of the conductive rubber 50 is tightly attached to the conductive foil 39 in order to make an electrical connection between the conductive rubber 50 and the conductive foil 39 when assembling the case body. An electrical and mechanical connection between the conductive foil 39 and the GND portion 42 on the flexible substrate 41 may be performed using a conductive adhesive (double-sided tape or the like) for example. A desired position which is available on the flexible substrate 41 is selected as the GND portion 42 on the flexible substrate 41. In an example illustrated in FIG. 6 to be described below, it may be possible to use a position around earphone side which is comparatively available in the area, or a returning position of a facing operation portion on the flexible substrate 41. The GND line and other signal line on the flexible substrate 41 are covered with a dielectric member, and a portion of a pattern of the GND line is exposed so as to be used.

The following items are the points in the embodiment.

(1) The conductive layer is formed in a position on an inner wall of the case body, which is nearer than the liquid module viewed from the ESD entry path.

(2) The conductive layer is connected to the GND in the terminal.

(3) There is no limitation on the position where the conductive layer is formed, if the conductive structure of (1) and (2) is maintained.

(4) The mechanism structure is rarely changed by the conductive structure described above.

(5) The low cost is realized, by forming the conductive layer and adding the structure of the GND connection.

However, recently, a so called transparent display has been developed. In the transparent display, high polymer dispersed liquid crystal is used between the transparent displays in which information is displayed on the display in the case of display ON and the rear surface side is transparently viewed through the display in the case of display OFF. Such transparent displays have reached the level of practical use. The high polymer dispersed liquid crystal has a characteristic that scatters incident light when applied voltage is in an OFF state and passes through the light as it is when applied voltage is in an ON state.

In this transparent display, since it is not possible to arrange an opaque mechanism structure on the rear surface side of the liquid crystal module, a frame structure used in the art may not be used. The embodiment of the invention is suitably applied to this transparent display.

Figure 4A:
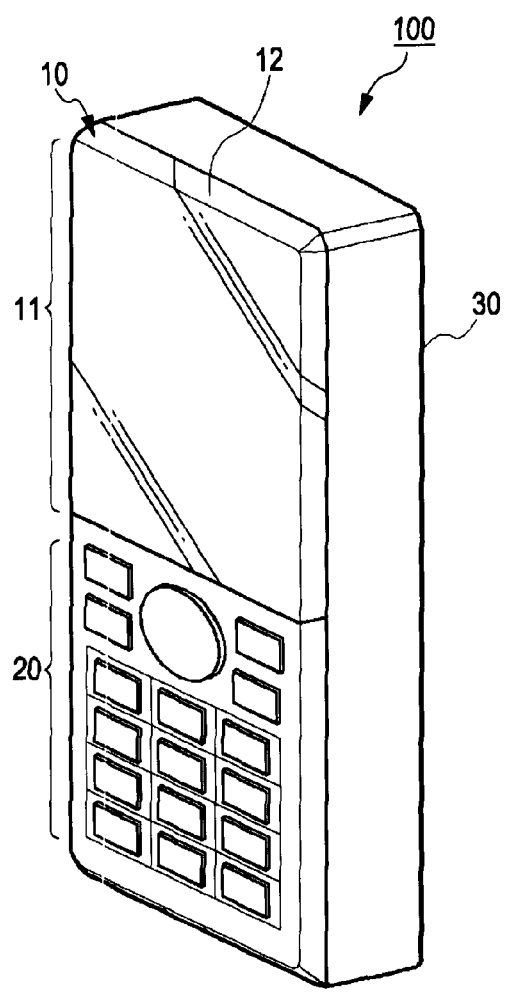
FIG. 4 is a diagram illustrating an appearance of a mobile phone terminal employing such a transparent display as an example of electronic device of an embodiment of the invention.
Figure 4B:
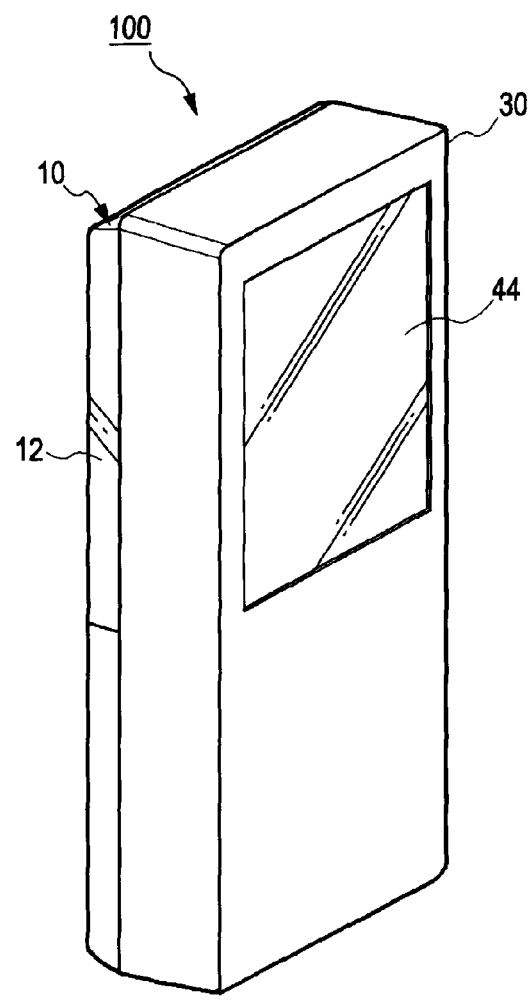
Figure 5A:
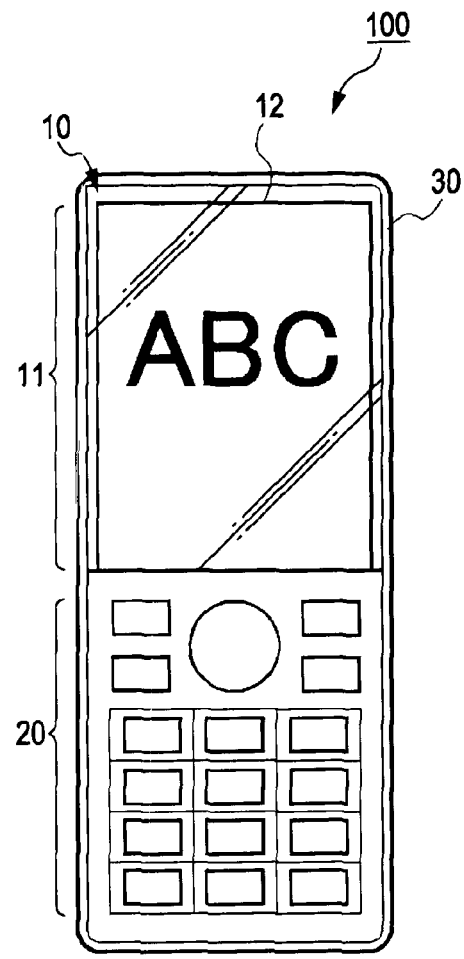
FIG. 5 is a perspective view (a) illustrating a front side of a mobile phone terminal illustrated in FIG. 4 and a perspective view (b) illustrating the rear side thereof.

In FIG. 4, an appearance of a mobile phone terminal 100 employing such a transparent display as an example of an electronic device of an embodiment of the invention is illustrated. FIG. 5(a) is a perspective view illustrating a front surface side, and FIG. 5(b) is a perspective view illustrating the rear surface side.

The mobile phone terminal 100 is a terminal of a so called straight type. The mobile phone terminal 100 has a liquid crystal module 10 (as an example of a flat display module) in front of it, and an operation portion 20 in its lower portion. A transparent plate is used as a front side portion of the case body in this embodiment (heretofore referred to as "transparent plate 12"). The transparent plate 12 defines a display portion 11 of the mobile terminal phone 100. A rear side of the transparent plate 12 overlaps a front side of a liquid crystal panel of the liquid crystal module 10 (not illustrated in FIG. 1). Together the transparent plate 12 and the liquid crystal module 10 provide a display screen of the display portion 11. The material of the transparent plate 12 may be synthetic resin such as acryl, glass or the like, for example. The liquid crystal module 10 may be formed with the transparent plate 12.

The mobile phone terminal 100 includes the rear surface side portion 30 of the case body coupled to the transparent plate 12 that is the front surface side portion of the case body. The mobile phone terminal 100 has a transparent window 44 on a rear side within the rear surface side portion 30 of the case body. The transparent window 44 provides a second display screen and corresponds to the display portion 11 on the front of the mobile phone terminal 100. As such, a transparent display is provided by the second display screen. Thus, when the display portion 11 is in a display state, the transparent window 44 can be used to view a side of the liquid crystal panel of the liquid crystal module 10 opposite from a side that is arranged on the rear side of the transparent plate 12. The liquid crystal panel according to the embodiment uses the high polymer dispersed liquid crystal (polymer network liquid crystal). While the window portion 44 may be a blank, it may be possible to construct the window portion 44 with a transparent panel member such as the transparent plate 12. Although not illustrated, when manipulating a palm or fingers on the rear side of the terminal and looking at the screen portion 11 while maintaining the terminal, for example, the palm or fingers are viewed through gaps in images displayed by the display portion 11.

Figure 5B:
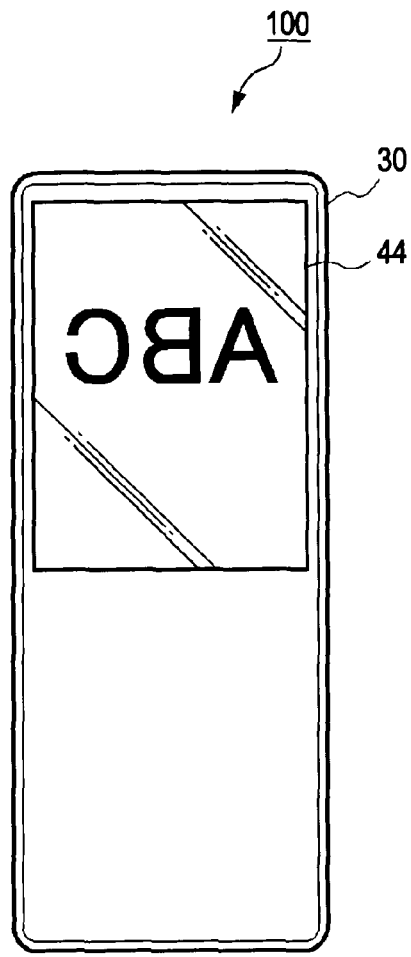

As illustrated in FIGS. 5(a) and 5(b), a mirror image of the image displayed by the display portion 11 (from the front) of the mobile phone terminal 100), can be viewed from the window 44 portion on the rear of the mobile phone terminal 100.

Figure 6:
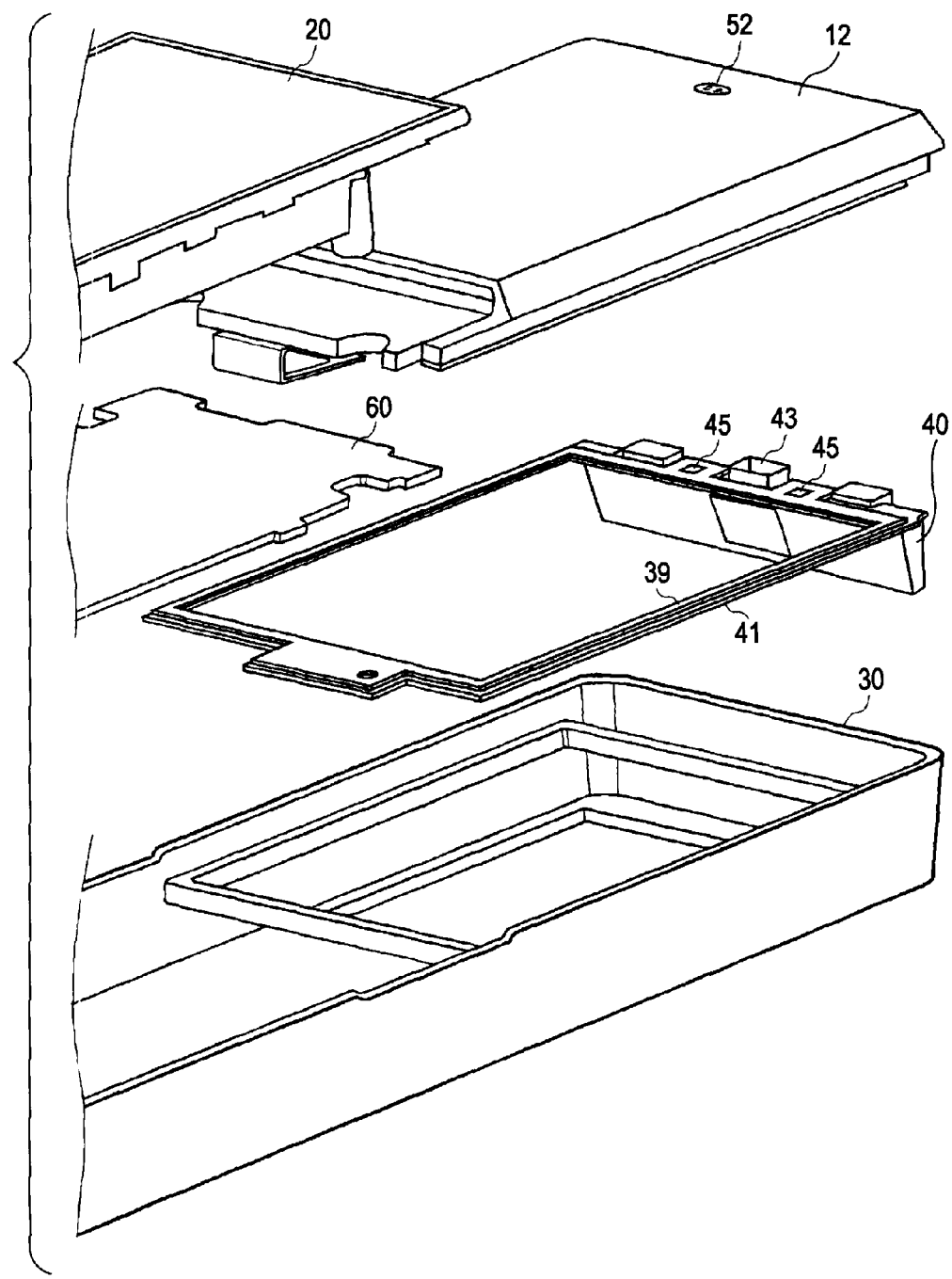
FIG. 6 is a disassembled perspective view illustrating a main portion of a mobile phone terminal illustrated in FIG. 4.
Figure 7:
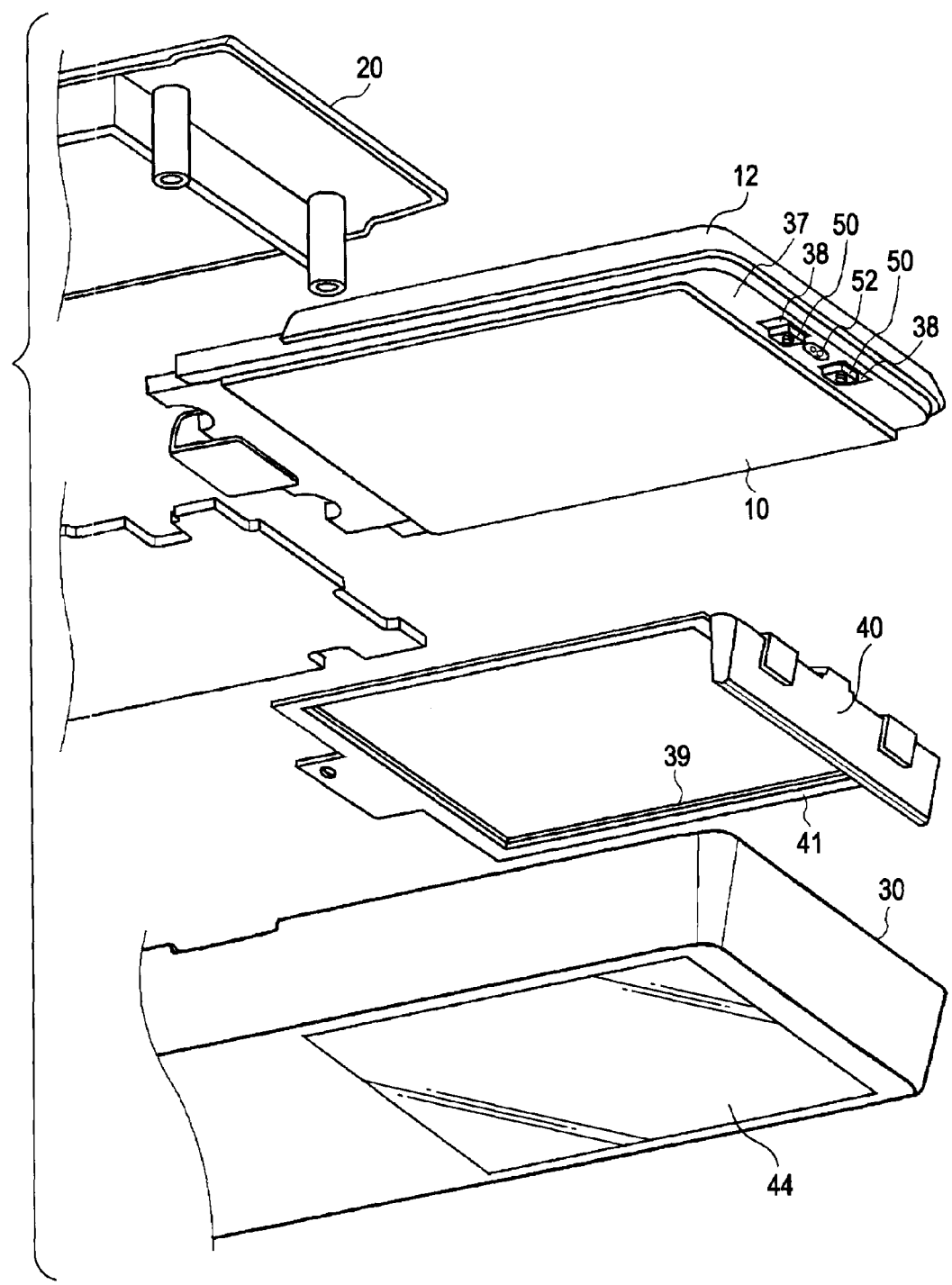
FIG. 7 is a disassembled perspective view illustrating a changed view point of FIG. 6.

Referring to FIG. 6, a disassembled perspective view of a main portion of the mobile phone terminal 100 is illustrated. FIG. 7 shows a disassembled perspective view from a different view point.

Figure 8:
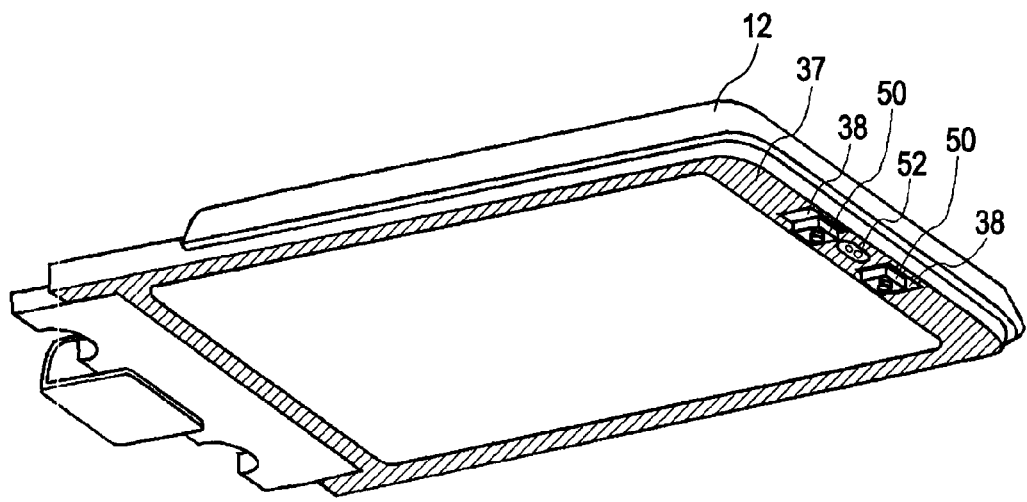
FIG. 8 is a diagram in which a liquid crystal panel is removed from a liquid crystal module in an embodiment of the invention so that a conductive layer formed on the rear side of a transparent plate is exposed and displayed.

FIG. 8 is a diagram in which a liquid crystal panel is removed from a liquid crystal module 10 so that a conductive layer 37 formed on the rear surface of a transparent plate 12 is exposed and displayed. According to the embodiment a conductive layer 37 is formed in a band shape or a ring shape, on a periphery of a surface of the rear side of the transparent plate 12. The conductive layer 37 also has an opening corresponding to an opening 52 in the transparent plate 12. A pair of conductive rubbers 50 is are arranged on both sides of the opening 52 on the conductive layer 37. The conductive rubbers are conductive members that are used to ground the conductive layer 37. While the number of positions to obtain the ground of the conductive layer 37 may be satisfied with 1 position theoretically, 2 positions are employed to guarantee the ground in this embodiment. Further, in this construction, blank areas on both sides of the opening 52 for soundproofing, are effectively used for a position to arrange the conductive member.

Figure 9:
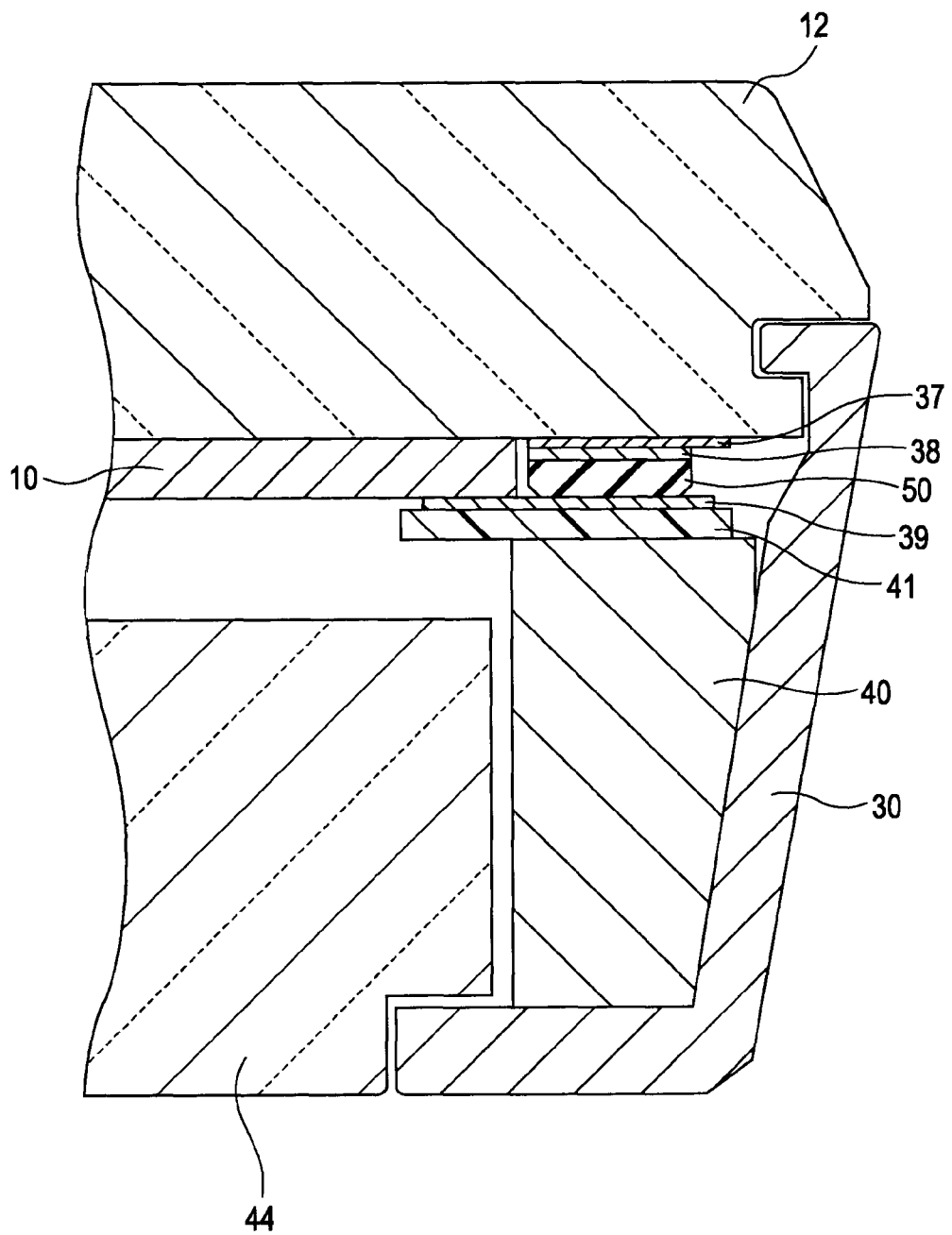
FIG. 9 is a sectional diagram along a longitudinal (length direction of a terminal) line passing through a conductive rubber, of a mobile phone terminal in an embodiment of the invention.
Figure 10:
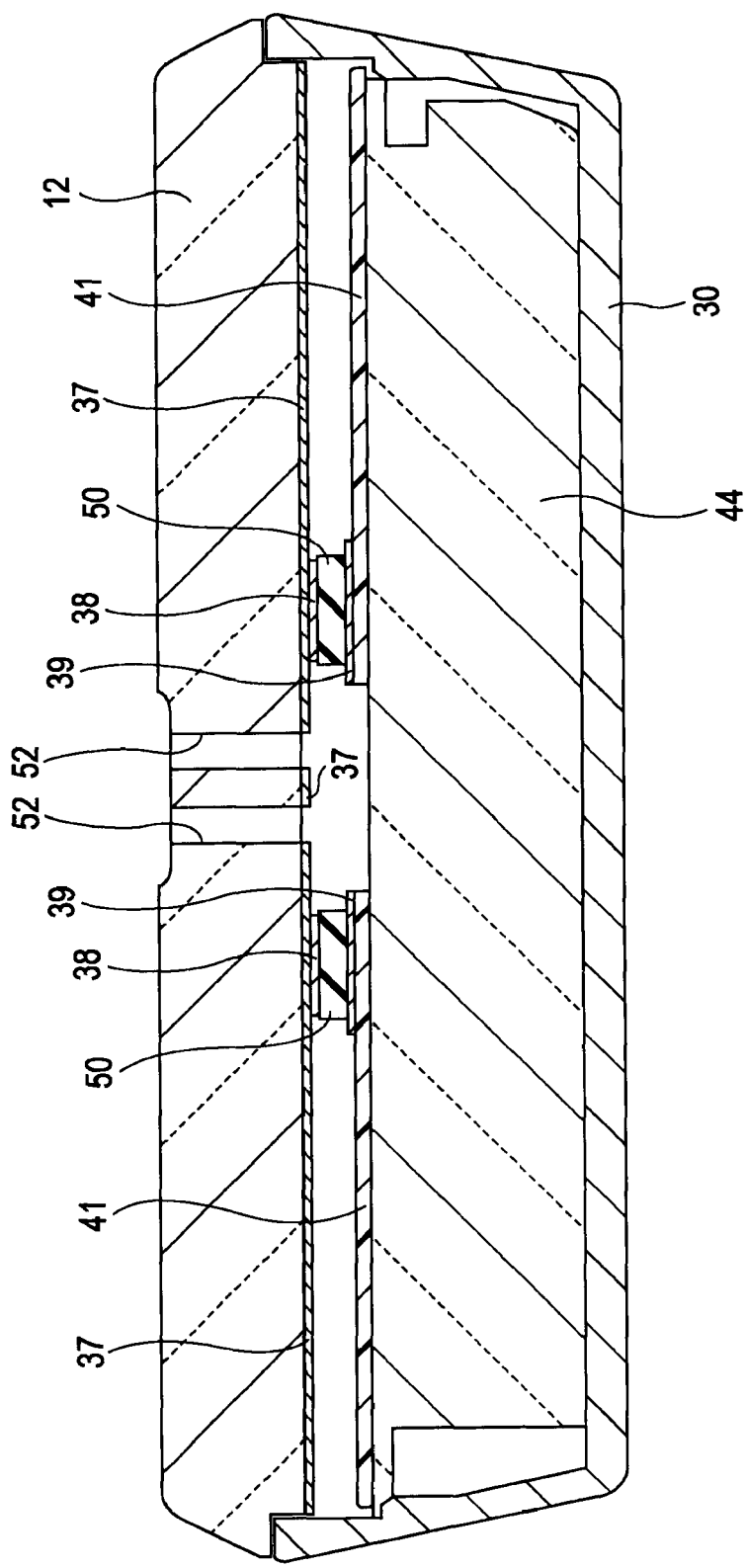
FIG. 10 is a sectional diagram along a horizontal line passing through both conductive rubbers, of a mobile phone terminal in an embodiment of the invention.

FIG. 9 is a sectional diagram along a longitudinal (length direction of a terminal) line passing through a conductive rubber 50. FIG. 10 is a sectional diagram along a horizontal line passing through both conductive rubbers 50.

As can be understood from these drawings, a liquid crystal module 10 is attached on the rear surface of the transparent plate 12. A liquid driving circuit or light source (not shown) is arranged on the lower end portion of the liquid crystal module 10, which is arranged to cover the upper end portion of the operation portion 20. In the rear part of the operation portion 20, the lower end portion of the liquid crystal module 10 is inserted so that the circuit board 60 is arranged. A middle structure 40 including a flexible substrate 41 is arranged behind the circuit board 60 and the liquid crystal display module 10. The middle structure body 40 is to provide the earphone portion (not shown) in the upper end portion of the terminal with power from the circuit board 60 through the flexible substrate 41. The conductive rubber as a conductive member is arranged beside the earphone portion. A soundproof opening 43 is arranged in the middle of the upper end portion of the middle structure body 40. The soundproof opening 43 goes through the opening 52 of the transparent plate 12 when assembling the terminal.

The conductive rubber 50 fixed on the conductive layer 37 is contacted with the position 45 corresponding to the conductive rubber 50 on the conductive foil 39 on the flexible substrate 41, and electrically connects the conductive layer 37 to the conductive foil 39. While a projection portion is formed on the front end of the conductive rubber 50 in the illustrated example, a hole portion is formed in the position 45, which is fitted to the projection portion. The projection portion is fitted to the hole portion when assembling so that a positional determination is performed between components. The conductive foil 39 is electrically connected to the GND portion 42 of the flexible substrate 41 in a desired position described above. Further, the projection portions and hole portions are omitted in FIGS. 9 and 10 for the sake of convenience. These projection portions and opening portions are not necessary for the embodiment of the invention.

Hereinbefore, while a preferred embodiment of the invention has been described, various modifications and changes may be available.

For example, while the flat display module is described with respect to the liquid crystal module, it may be applied to other flat display module such as organic EL and plasma.

While the conductive rubber as the conductive member is arranged in 2 positions, only 1 position, or 3 or more positions may be available. While the conductive rubber is illustrated as non-surface mounting type, a surface mounting type (for example, disclosure in the publication of JP-T-2000-541859) may be available. Further, the conductive member is not limited to the conductive rubber but may be an available arbitrary member with which the conductive layer and GND position are electrically connected. For example, it may be a conductive gasket or the like. While the conductive foil 38 contributes to enhance the tolerance to ESD as described above, the conductive foil 38 is not necessary for an embodiment of the invention. Also, the conductive foil 39 is not necessary for an embodiment of the invention, and a GND opening portion is formed on the flexible substrate 41 and the conductive rubber 50 and the GND opening portion may be directly contacted each other.

While the mobile phone terminal is illustrated as a so called straight type only, it may be possible to apply an embodiment of the invention to a folder type or slide type terminal including the upper side case body and lower side case body. In that case, one case body (for example, the upper case body) may include a transparent display.

The present application contains subject matter related to that disclosed in Japanese Priority Patent Application JP 2009-254702 filed in the Japan Patent Office on Nov. 6, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
   a case body including a front surface side portion defining a first internal surface of the case body and a first external surface of the case body, and a rear surface side portion defining a second internal surface of the case body and a second external surface of the case body, wherein the second external surface faces an opposite direction from a direction that the first external surface faces;
   a flat display module accommodated in the case body;
   a conductive layer formed on one of the first internal surface and the second internal surface of the case body, wherein the conductive layer is formed adjacent to a contact location of the case body where the front surface side portion contacts the rear surface side portion;
   a circuit board having electrical components mounted thereon and provided between the front surface side portion and the rear surface side portion; and
   a conductive member adjacent to the contact location of the case body that electrically connects the conductive layer to a GND of the circuit board.

2. The electronic device according to claim 1, wherein the front surface side portion of the case body is a transparent plate,
   wherein a rear surface side of the transparent plate defines the first internal surface of the case body, and the conductive layer is formed on the rear surface side of the transparent plate.

3. The electronic device according to claim 2, wherein the conductive layer is formed in a band shape along the periphery of the rear surface side of the transparent plate.

4. The electronic device according to claim 1, wherein the conductive member is formed by a conductive rubber that has elasticity.

5. The electronic device according to claim 4, wherein a conductive foil covers a portion of the conductive layer, and the conductive member is in contact with the conductive layer through the conductive foil.

6. The electronic device according to claim 4 or 5, including a flexible substrate arranged in the case body,
   wherein the conductive member is electrically connected to the GND of the circuit board through the flexible substrate.

7. The electronic device according to claim 6, wherein the electronic device is a mobile phone terminal having an earphone portion on an upper end portion of the case body, the conductive member is provided on a side portion of earphone portion, and the flexible substrate provides the earphone portion with a signal.

8. The electronic device according to claim 1, wherein a protective film covers a portion of the conductive layer.

9. The electronic device according to claim 1, wherein a flat display window panel forms a transparent display.

10. A flat display module comprising:
    a flat display panel;
    a transparent plate that is arranged to overlap with a front surface of the flat display panel;
    a driving circuit that drives the flat display panel;
    a conductive layer formed on a peripheral portion of a rear surface of the transparent plate;
    a conductive member extending from a contact location of the conductive layer and including a conductive core to electrically connect the conductive layer to an external GND;
    a conductive foil disposed between the conductive layer and the conductive member at the contact location;
    a protective film covering the conductive layer, wherein the protective film is not provided on the conductive layer in an area of the contact location where the conductive core electrically connects to the conductive layer.

11. The flat display module according to claim 10, wherein the conductive member is formed by a conductive rubber that has elasticity.

12. An electronic device comprising:
    a case body including a front surface side portion defining a first internal surface of the case body and a first external surface of the case body, and a rear surface side portion defining a second internal surface of the case body and a second external surface of the case body, wherein the second external surface faces an opposite direction from a direction that the first external surface faces;
    a flat display module accommodated in the case body;
    a conductive layer formed on one of the first internal surface and the second internal surface of the case body, wherein the conductive layer is formed adjacent to a contact location of the case body where the front surface side portion contacts the rear surface side portion;
    a circuit board having electrical components mounted thereon and provided between the front surface side portion and the rear surface side portion; and a ground unit adjacent to the contact location of the case body that electrically connects the conductive layer to a GND of the circuit board.

13. The electronic device according to claim 1, further comprising:
a conductive foil disposed between the conductive layer and the conductive member at a contact location of the conductive layer;
a protective film covering the conductive layer, wherein
the conductive member extends from a contact location of the conductive layer and includes a conductive core to electrically connect the conductive layer to an external GND, and
the protective film is not provided on the conductive layer in an area of the contact location where the conductive core electrically connects to the conductive layer.

14. The electronic device according to claim 6, wherein the flexible substrate further comprises:
a GND portion;
a second conductive foil on a surface of the flexible substrate facing the conductive layer and electrically connected to the GND portion;
a hole portion that receives a projection of the conductive member,
wherein the conductive member electrically connects the conductive layer to the second conductive foil.

* * * * *